(12) United States Patent
Ibrahim et al.

(10) Patent No.: US 7,974,590 B2
(45) Date of Patent: Jul. 5, 2011

(54) METHOD AND SYSTEM FOR SIMULTANEOUS SIGNAL TRANSMISSION ON MULTIPLE SELECTED FREQUENCIES

(75) Inventors: Brima Babatunde Ibrahim, Aliso Viejo, CA (US); John Walley, Ladera Ranch, CA (US); Bojko Marholev, Irvine, CA (US); Siukai Mak, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 817 days.

(21) Appl. No.: 11/855,217

(22) Filed: Sep. 14, 2007

(65) Prior Publication Data

US 2008/0233897 A1 Sep. 25, 2008

Related U.S. Application Data

(60) Provisional application No. 60/895,665, filed on Mar. 19, 2007.

(51) Int. Cl.
*H04B 1/04* (2006.01)
(52) U.S. Cl. .............. 455/103; 455/296; 455/226.1; 455/323; 455/302; 455/326; 375/329; 375/349
(58) Field of Classification Search .......... 455/103, 455/296, 226.1, 323, 302, 326, 343.1; 375/329, 375/349
See application file for complete search history.

(56) References Cited

U.S. PATENT DOCUMENTS

| | | | | |
|---|---|---|---|---|
| 6,240,142 B1 * | 5/2001 | Kaufman et al. | | 375/261 |
| 6,504,879 B1 * | 1/2003 | Iwamatsu | | 375/298 |
| 7,020,221 B2 * | 3/2006 | Glas et al. | | 375/329 |
| 7,146,146 B2 * | 12/2006 | Masenten et al. | | 455/296 |
| 2003/0189989 A1 * | 10/2003 | Kroeger | | 375/295 |

* cited by examiner

*Primary Examiner* — Sanh D Phu
(74) *Attorney, Agent, or Firm* — McAndrews, Held & Malloy, Ltd.

(57) ABSTRACT

Aspects of a method and system for simultaneous signal transmission on multiple selected frequencies may include generating from a single baseband signal, a plurality of radio frequency transmission signals each at a different radio frequency, wherein the single baseband signal comprises an in-phase signal component and/or a quadrature signal component. The single baseband signal, to generate said plurality of radio frequency transmission signals, may be modulated in a single radio frequency transmission chain, the radio frequency transmission chain comprising intermediate frequency modulation and radio frequency modulation. The plurality of radio frequency transmission signals may be a radio frequency signal and a corresponding image frequency signal, based on the intermediate frequency modulation and the radio frequency modulation. The signals resulting from the intermediate frequency modulation and the radio frequency modulation may be filtered to preserve the radio frequency signal and the corresponding image frequency signal.

20 Claims, 6 Drawing Sheets

METHOD AND SYSTEM FOR SIMULTANEOUS SIGNAL TRANSMISSION ON MULTIPLE SELECTED FREQUENCIES

CROSS-REFERENCE TO RELATED APPLICATIONS/INCORPORATION BY REFERENCE

This application makes reference to, claims priority to, and claims the benefit of U.S. Provisional Application Ser. No. 60/895,665, filed on Mar. 19, 2007.

The above referenced application is hereby incorporated herein by reference in its entirety.

FIELD OF THE INVENTION

Certain embodiments of the invention relate to signal processing for communication systems. More specifically, certain embodiments of the invention relate to a method and system for simultaneous signal transmission on multiple selected frequencies.

BACKGROUND OF THE INVENTION

Electronic communication has become prolific over the last decade. While electronic communication was initially limited to the desktop, recent trends have been to make communications, media content and the Internet available anytime, anywhere and, increasingly, on any device. Already now, it is quite common to find mobile devices such as cellular phones or Personal Digital Assistants (PDAs) that incorporate a large range of communication technologies and associated software. For example, fully-featured web-browsers, email clients, MP3 players, instant messenger software, and Voice-over-IP may all be found on some recent devices.

In this same spirit of the 'anytime, anywhere' paradigm, there is a drive towards making content stored on portable devices available on a variety of displays and user interfaces. For example, many portable media devices may be enabled to provide a video output signal to a computer monitor or a television to allow display of, for example, digital photographs. For audio content, one possible output format may be a low-power FM transmission signal. Recent changes, for example, in European regulation by CEPT/ETSI to the category of Short Range Devices (SDR) may now permit the use of very low power FM transmitters to transmit in the FM radio broadcast spectrum at powers of around 50 nW. Such devices interfere with and may experience interference from regular FM broadcast radio and it may hence be desirable to enhance coexistence between FM broadcast stations and personal FM microtransmitters.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for simultaneous signal transmission on multiple selected frequencies, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for simultaneous signal transmission on multiple selected frequencies. Aspects of the method and system for simultaneous signal transmission on multiple selected frequencies may comprise generating from a single baseband signal, a plurality of radio frequency transmission signals each at a different radio frequency, wherein the single baseband signal comprises an in-phase signal component and/or a quadrature signal component. The single baseband signal, to generate said plurality of radio frequency transmission signals, may be modulated in a single radio frequency transmission chain, the radio frequency transmission chain comprising intermediate frequency modulation and radio frequency modulation.

The plurality of radio frequency transmission signals may be a radio frequency signal and a corresponding image frequency signal, based on the intermediate frequency modulation and the radio frequency modulation. The signals resulting from the intermediate frequency modulation and the radio frequency modulation may be filtered to preserve the radio frequency signal and the corresponding image frequency signal. The radio frequency signal may be centered at a frequency f1+f2 and the image frequency signal may be centered at a frequency f1−f2, where f1 and f2 are frequencies. The frequencies f1 and f2 may correspond to the radio frequency modulation and the intermediate frequency modulation. The plurality of radio frequency transmission signals may be frequency-modulated signals. In the radio frequency transmission chain, a plurality of intermediate frequency signal components may be summed and the radio frequency modulation may be performed on the sum of the intermediate frequency signal components. In another embodiment of the invention, a plurality of radio frequency signal components may be summed in the radio frequency transmission chain, to obtain the plurality of radio frequency transmission signals.

Figure 1:
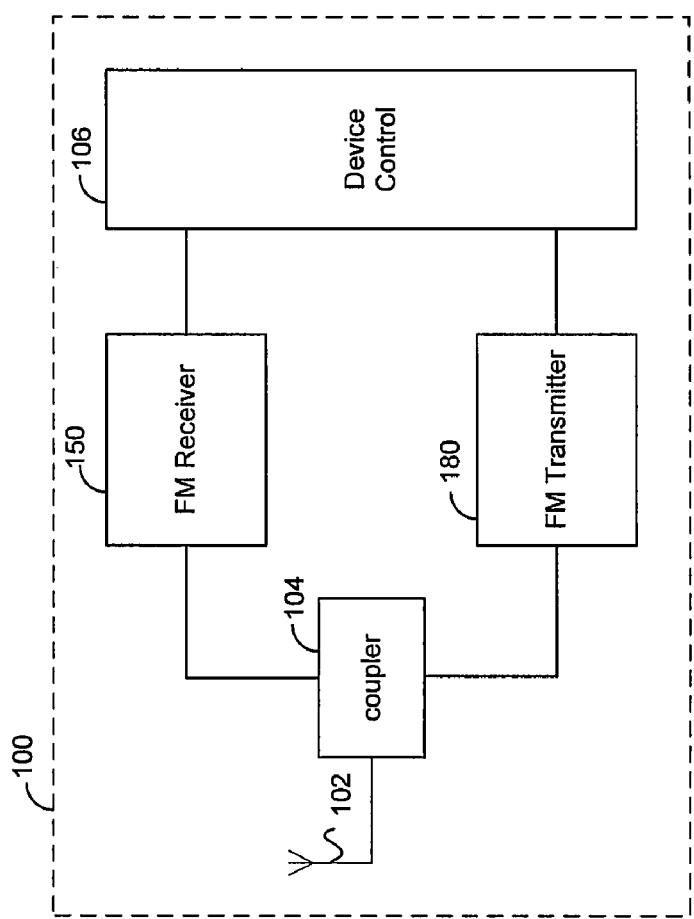
FIG. 1 is a block diagram illustrating an exemplary FM transceiver system, in accordance with an embodiment of the invention.

FIG. 1 is a block diagram illustrating an exemplary FM transceiver system, in accordance with an embodiment of the invention. Referring to FIG. 1, there is shown an FM transceiver system 100 comprising an antenna 102, a coupler 104, an FM receiver 150, an FM transmitter 180 and a device control 106.

The FM transceiver system 100 may comprise suitable logic, circuitry and/or code that may be enabled to transmit and receive FM signals simultaneously on different frequencies and/or in an alternating fashion on the same frequency. The FM transmitter 180 may comprise suitable logic, circuitry and/or code to enable generation of a transmit signal that may be communicated to the coupler 104. The FM receiver 150 may comprise suitable logic, circuitry and/or logic that may enable reception and/or processing of FM signals, fed to it from the coupler 104. The antenna 102 may be a shared antenna for a transmit signal path and a receive signal path. The transmit signal path from the FM transmitter 180 and the receive signal path to the FM receiver 150 may be coupled to the antenna 102 at the coupler 104 that may comprise suitable logic, circuitry and/or code to join the receive signal path and the transmit signal path, in order to communicatively couple a common signal path to antenna 102. A device control block 106 may comprise suitable logic, circuitry and/or code to enable controlling the FM transmitter 180 and the FM receiver 150. The control block 106 may control, for example, a gain and/or a demodulation frequency in the FM receiver 150 and, for example, a transmit power and frequency of the FM transmitter 180. The functionality of the device control block 106 may not be limited to the functionality described above.

In various other embodiments of the invention, the FM transceiver system 100 may not comprise an FM receiver 150; and/or the FM receiver 150 and the FM transmitter 180 may use separate antennas. In various other embodiments of the invention, the FM transceiver system 100 may be a stand-alone system or may form part of a device, for example, a personal audio player or a cellular mobile phone. The invention may not be limited to the examples given above.

Figure 2:
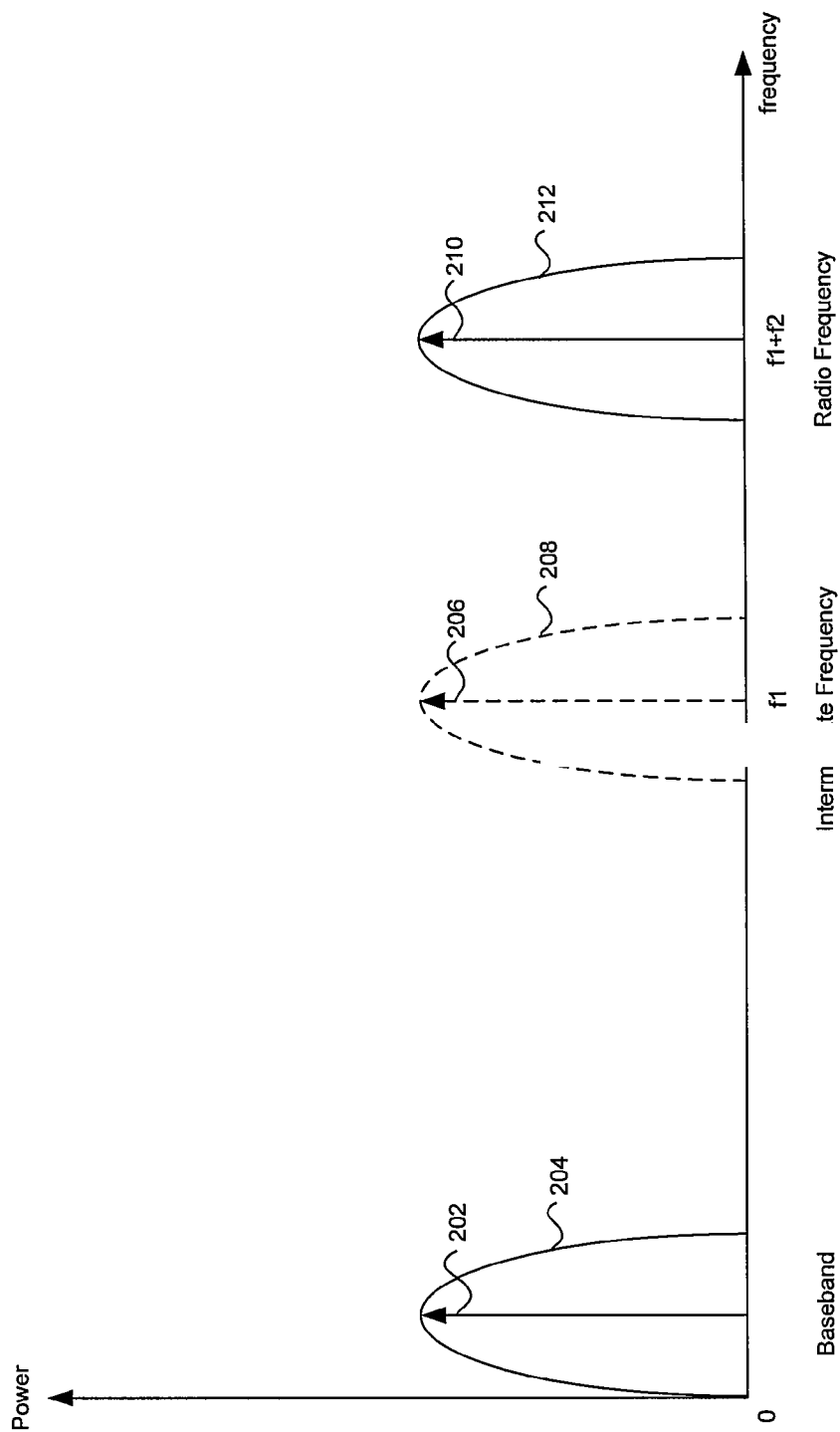
FIG. 2 is a frequency diagram illustrating an exemplary FM transmitter frequency band, in accordance with an embodiment of the invention.

FIG. 2 is a frequency diagram illustrating an exemplary FM transmitter frequency band, in accordance with an embodiment of the invention. Referring to FIG. 2, there is shown a baseband spectrum 204 with a baseband center frequency 202, an intermediate frequency (IF) spectrum 208 with an IF center frequency 206, and a radio frequency (RF) spectrum 212 with an RF center frequency 210.

In many RF systems, a baseband signal may be generated, which may generally comprise low-frequency signal components. Most signal processing may generally take place at low signal frequencies since practical implementation of low-frequency components may be desirable. In the case of an FM transmitter system, the baseband signal may be, for example, an FM-modulated stereo audio signals such as music or speech. The baseband spectrum 204 may depict an exemplary frequency band of a baseband signal. The baseband spectrum 204 may, for example, indicate the signal power as a function of frequency. As depicted in FIG. 2, the baseband signal may typically be band-limited, that is, most of the signal energy may be concentrated in a limited band of frequencies. For example, high quality audio may be concentrated between 20 Hz and 20 kHz or telephone quality voice may be concentrated between 400 Hz and 3400 Hz.

In order to transmit the baseband signal by means of radio signals, the baseband signal may need to be shifted to higher frequencies that may be more amenable to radio transmission. For example, most FM radio stations broadcast at frequencies near 100 MHz. In order to transform a baseband signal to a radio frequency signal, it may be desirable to translate the baseband spectrum 204 to a corresponding radio frequency spectrum 212, where the radio frequency spectrum may be concentrated near a carrier frequency that may be suitable for transmission as a radio signal. In many radio systems, frequency translation of the baseband spectrum 212 to the RF spectrum 212 may be achieved via an intermediate frequency spectrum 208. In some systems, the intermediate frequency spectrum may be at a fixed frequency, whereas the RF frequency for transmission may be variable. In those cases, for example, certain signal processing may occur at the intermediate frequency. One advantage of this may be that the characteristics of the processing blocks at IF may be more narrowband than they may need to be at the higher RF frequencies. In other words, it may be desirable for most components to be tuned to operate over a narrow range of frequencies.

The frequency translation to intermediate frequency and the frequency translation to radio frequency may typically require appropriate filters to reject image frequencies. Image frequencies may in some cases be undesired frequency components that may arise from the modulation process and may be reduced by appropriate filtering.

Figure 3:
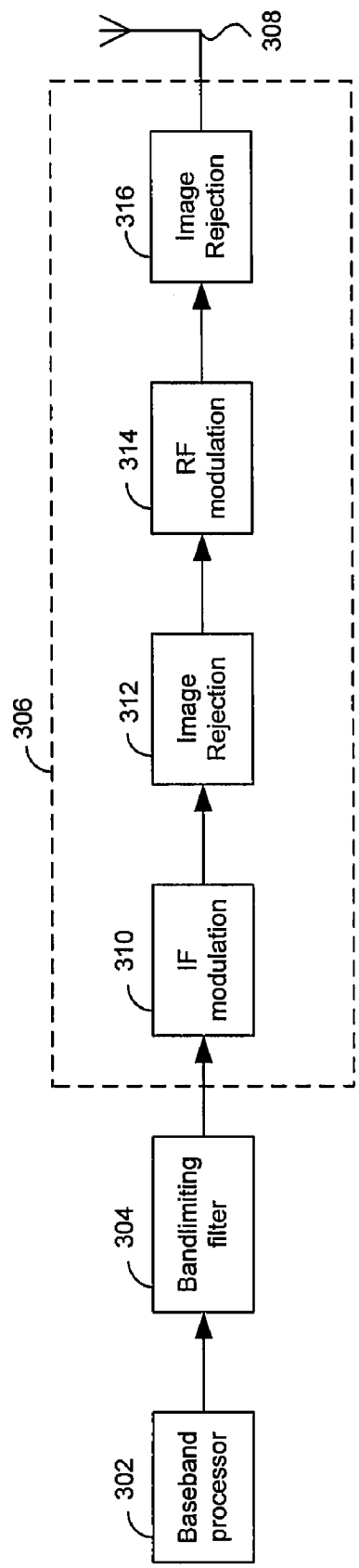
FIG. 3 is a block diagram illustrating an exemplary FM transmitter system, in accordance with an embodiment of the invention.

FIG. 3 is a block diagram illustrating an exemplary FM transmitter system, in accordance with an embodiment of the invention. Referring to FIG. 3, there is shown a baseband processor 302, a band-limiting filter 304, an RF transmitter chain 306 and an antenna 308. The RF transmitter chain 306 may comprise an IF modulation block 310, image rejection blocks 312 and 316, and RF modulation block 314. The baseband processor 302 may comprise suitable logic, circuitry and/or code that may be enabled to generate a baseband signal, which may comprise an in-phase and/or a quadrature component. The baseband signal generated in the baseband processor 302 may be communicatively coupled to the band-limiting filter 304. The baseband processor 302 and the band-limiting filter 304 may generate a signal spectrum similar to, for example, the baseband spectrum 204 shown in FIG. 2. The filtered baseband signal may be modulated to intermediate frequency (IF) in the IF modulation block 310. The image rejection block 312 may comprise suitable logic, circuitry and/or code that may be enabled to reduce undesirable IF signal components. The output signal of the image rejection block 312 may be coupled to the RF modulation block 314. The RF modulation block 314 may comprise suitable logic, circuitry and/or code that may be enabled to modulate the filtered IF signal to radio frequency. The image rejection block 316 may comprise suitable logic, circuitry and/or code that may be enabled to reduce undesired RF frequency components. The output signal of the RF transmitter chain 306 may be communicatively fed to the antenna 308, where the RF signal may be transmitted from.

Some FM radio transmitters may transmit Radio Data System (RDS) or Radio Broadcast Data System (RBDS) with the audio signal in, for example, Europe and the USA, respectively. RDS/RBDS may be used to send certain data embedded in an FM radio broadcast. For example, RDS/RBDS may comprise a transmit station identifier (PI) and alternate frequencies (AF identifier). Based on the station identifier and alternate frequency information, the FM radio receiver may switch to a better reception quality frequency without interrupting the reception for the listener. In this regard, a traveling car, for example, may seamlessly switch from radio transmitter to radio transmitter that may provide good and uninterrupted reception quality to the listener as the vehicle travels through the coverage area of various radio transmitters.

Hence, by including suitable RDS/RBDS signals, for example, a baseband signal generated in the baseband processor 302 may comprise information that may enable a suitable FM receiver to automatically change to the best quality reception frequency.

In the case of a portable, low-power FM transmitter that may be used, for example, to broadcast audio from a personal audio player for reception by an FM receiver inside a vehicle, it may be possible to broadcast the audio on multiple channels that may be switched automatically based on suitable RDS/RDBS information comprised in the baseband signal (and hence, the RF signal).

Typically, a generated RF bandpass signal for transmission over an antenna may be similar to s'(t), given by the following relationship:

$$s'(t) = s_I(t)\cos(w_1 t) + s_Q(t)\sin(w_1 t)$$

where $s_I(t)$ may be the in-phase baseband component and $s_Q(t)$ may be a quadrature baseband component and $w_1 = 2\pi f_1$ may be the angular frequency that may define the carrier frequency at radio frequency. In accordance with an embodiment of the invention, an FM transmitter may desire to transmit one or more identical channels at several different frequencies, so that the FM receiver may switch between the two channels, based on the RDS/RBDS information and the quality of reception. In this case, the desired transmitted signal may be similar to s(t), given by the following relationship for two channels at different frequencies:

$$s(t) = s_I(t)\cos(w_1 t) + s_Q(t)\sin(w_1 t) + s_I(t)\cos(w_2 t) + s_Q(t)\sin(w_2 t) \quad (1)$$

where baseband signals $s_I(t)$ and $s_Q(t)$ may be transmitted on angular frequencies $w_1$ and $w_2$. Such a transmission signal may be generated, in accordance with an embodiment of the invention.

Equation (1) may be rewritten by defining $w_1 = w_a + w_b$ and $w_2 = w_a - w_b$ as given by the following relationship:

$$\begin{aligned} s(t) &= s_I(t)\cos(w_1 t) + s_Q(t)\sin(w_1 t) + s_I(t)\cos(w_2 t) + s_Q(t)\sin(w_2 t) \\ &= s_I(t)[\cos(w_a t + w_b t) + \cos(w_a t - w_b t)] + s_Q(t)[\sin(w_a t + w_b t) + \sin(w_a t - w_b t)] \\ &= 2s_I(t)\cos(w_a t)\cos(w_b t) + 2s_Q(t)\sin(w_a t)\cos(w_b t) \\ &= 2\cos(w_b t)[s_I\cos(w_a t) + s_Q(t)\sin(w_a t)] \end{aligned} \quad (2)$$

Based on line 2 of equation (2), the desired signal comprises of a frequency $w_1$ and its image frequency $w_2$. However, in accordance with an embodiment of the invention, the image frequency $w_2$ may be a desired signal component and may hence not be removed.

The exemplary embodiment of the invention illustrated above may be generalized to a greater number of channels that may be generated. In a more general setting, a desired transmitted signal may generate multiple channels, as illustrated in the following relationship, that may be one generalization of equation (2):

$$s(t) = 2^{N-1}\left(\prod_{i=1}^{N-1}\cos(w_i t)\right) s_N(t)$$

$$s_N(t) = s_I(t)\sin(w_N t) + s_Q(t)\sin(w_N t)$$

Where N frequencies may be available that may generate $2^{N-1}$ different channels, such as given by the following relationship.

$$s(t) = \sum_{k=1}^{2^{N-1}} (s_I(t)\sin(u_k t) + s_Q(t)\sin(u_k t))$$

It may be observed that the set of channels $\{u_k\}$ may comprise the frequencies that may be generated from the set of generating frequencies, that is, $\{u_k\}|_{k=\{1,\ldots,2^{N-1}\}} = \{w_1 \pm w_2 \pm \ldots \pm w_N\}$.

In some instances, it may be desirable to adjust channel amplitudes differently for different channels. This may be achieved, for example, by suitably varying amplitudes and/or phases of channel signal components. An exemplary embodiment of the invention for two channels similar to equation (2), for example, may be given by the following relationship:

$$\begin{aligned} s(t) &= R_1[s_I(t)\cos(w_1 t) + s_Q(t)\sin(w_1 t)] + R_2[s_I(t)\cos(w_2 t) + s_Q(t)\sin(w_2 t)] \\ &= s_I(t)[(R_1+R_2)\cos(w_a t)\cos(w_b t) + (R_2-R_1)\sin(w_a t)\sin(w_b t)] + \\ &\quad s_Q(t)[(R_1+R_2)\sin(w_a t)\cos(w_b t) + (R_1-R_2)\cos(w_a t)\sin(w_b t)] \\ &= (R_1+R_2)\cos(w_b t)[s_I(t)\cos(w_a t) + s_Q(t)\sin(w_a t)] + \\ &\quad (R_2-R_1)\cos(w_b t + \pi/2)[s_I(t)\cos(w_a t + \pi/2) + s_Q(t)\sin(t)\sin(w_a t + \pi/2)] \end{aligned} \quad (3)$$

where $R_1$ and $R_2$ may be amplitude coefficients for a channel at angular frequency $w_1$ and a channel at angular frequency $w_2$, respectively. As may be seen from equation (3), in some instances, suitably adjusting phase and/or amplitude coefficients may provide adjustable amplitudes for the resulting channels. The resulting channels may comprise, for example, angular frequency $w_1 = w_a + w_b$ and image frequency $w_2 = w_a - w_b$.

Figure 4A:
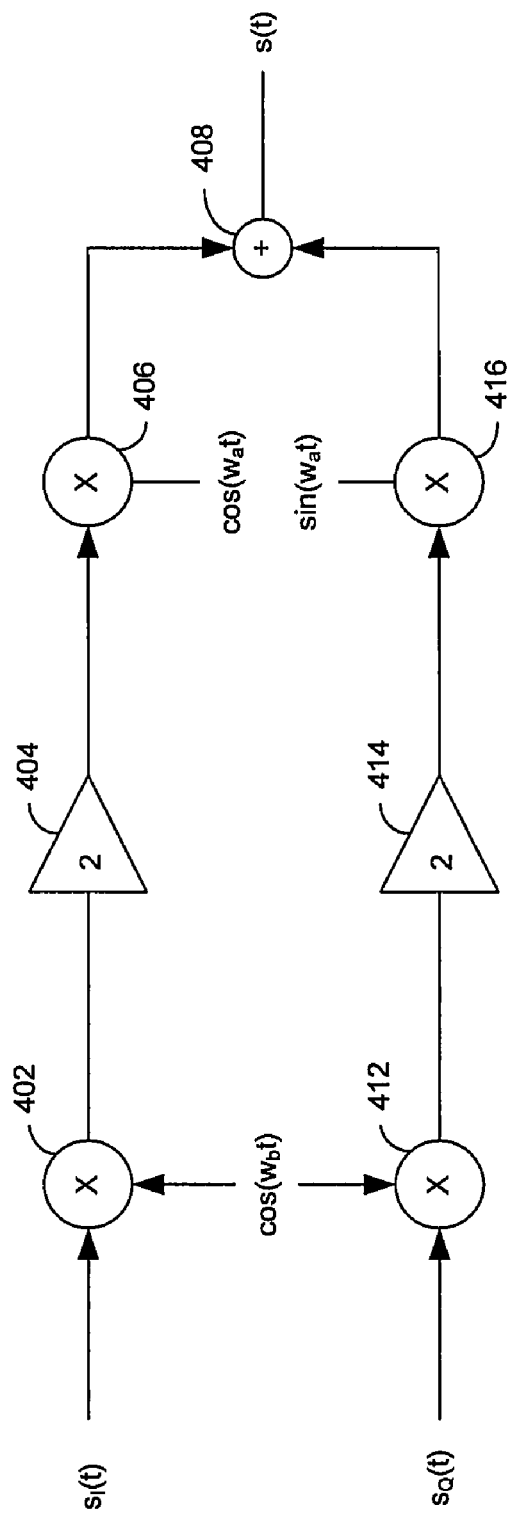
FIG. 4A is a circuit diagram illustrating an exemplary embodiment of a dual channel FM transmitter, in accordance with an embodiment of the invention.

FIG. 4A is a circuit diagram illustrating an exemplary embodiment of a dual channel FM transmitter, in accordance with an embodiment of the invention. Referring to FIG. 4A, there is shown multipliers 402, 412, 406 and 416, amplifiers 404 and 414, and adder 408. There is also shown an in-phase baseband signal $s_I(t)$, a quadrature baseband signal $s_Q(t)$, a carrier $\cos(w_b t)$, a carrier $\cos(w_a t)$, a carrier $\sin(w_a t)$ and RF signal s(t).

The circuit diagram in FIG. 4A may be substantially similar to an exemplary embodiment of an RF transmitter chain 306, in accordance with an embodiment of the invention. The multipliers 402, 406, 412 and 416 may comprise suitable logic, circuitry and/or code that may enable the multiplication of two input signals. The baseband in-phase signal $s_1(t)$ may be multiplied with a carrier $\cos(w_b t)$ in multiplier 402 and fed to amplifier 404. The amplifiers 404 and 414 may comprise suitable logic, circuitry and/or code that may enable the amplification of the signals that may be applied to their respective inputs. The amplified signal at the output of amplifier 404 may be communicatively coupled to the multiplier 406 for multiplication with a carrier $\cos(w_a t)$. The output of the multiplier 406 may be coupled to adder 408.

The baseband quadrature signal $s_Q(t)$ may be multiplied with a carrier $\cos(w_b t)$ in multiplier 412 and fed into amplifier 414. The amplified signal at the output of amplifier 414 may be communicatively coupled to the multiplier 466 for multiplication with a carrier $\sin(w_a t)$. The output of the multiplier 416 may be coupled to adder 408. The output signal of adder 408 may be RF signal s(t) which may be similar to s(t) in Equation (2) above.

This embodiment of the invention may be similar to a modulation with an intermediate frequency, whereby the baseband signals may be modulated onto a carrier $\cos(w_b t)$ to intermediate frequency, followed by a modulation onto carriers $\cos(w_a t)$ and $\sin(w_a t)$ that may enable the RF signal s(t) to be generated.

Figure 4B:
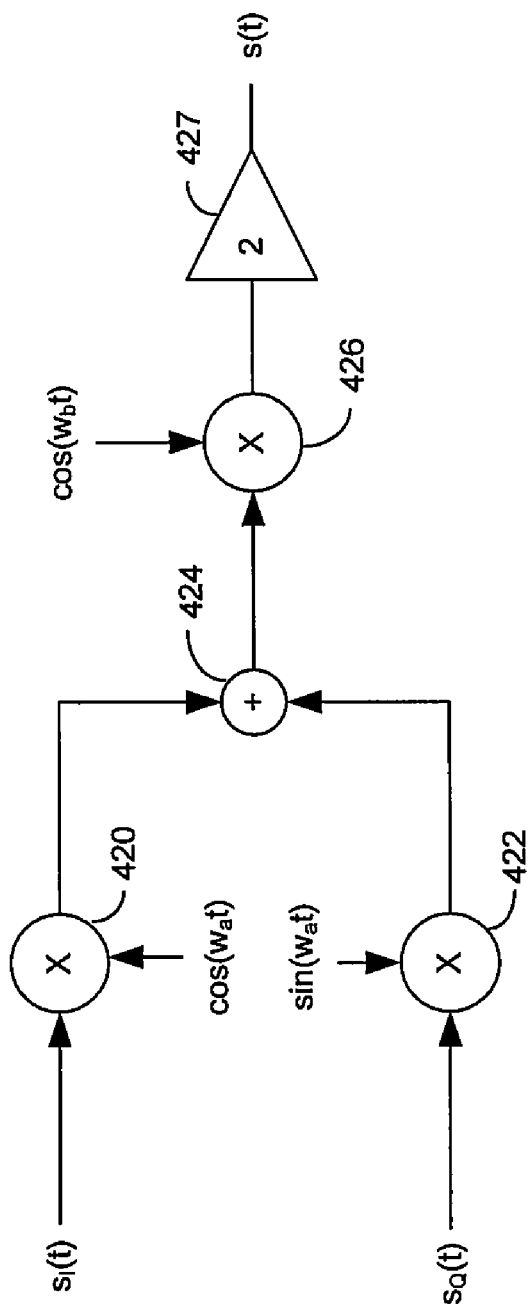
FIG. 4B is a circuit diagram illustrating an exemplary embodiment of a dual channel FM transmitter, in accordance with an embodiment of the invention.

FIG. 4B is a circuit diagram illustrating an exemplary embodiment of a dual channel FM transmitter, in accordance with an embodiment of the invention. Referring to FIG. 4B, there is shown multipliers 420, 422 and 426, adder 424 and amplifier 427. There is also shown carriers $\cos(w_a t)$, $\sin(w_a t)$ and $\cos(w_b t)$, in-phase baseband signal $s_I(t)$, quadrature baseband signal $s_Q(t)$ and RF signal s(t).

In FIG. 4B, another embodiment of the invention to generate the desired signal s(t) of Equation 2, of a dual channel FM transmitter, may be illustrated. The in-phase baseband signal $s_I(t)$ may be modulated onto a carrier $\cos(w_a t)$ at the multiplier 420. The multipliers 420, 422 and 427 may comprise suitable logic, circuitry and/or code that may be enabled to multiply two input signals. The quadrature baseband signal $s_Q(t)$ may be modulated onto a carrier $\sin(w_a t)$ in the multiplier 422. The output signals of the multipliers 420 and 422 may be considered intermediate frequency in-phase and quadrature signal components, respectively, and may be added in the adder 424. The sum of the intermediate frequency components may be modulated to radio frequency by multiplication with the carrier $\cos(w_b t)$ in the multiplier 426. The RF signal at the output of the multiplier 426 may be amplified in the amplifier 427.

Figure 5:
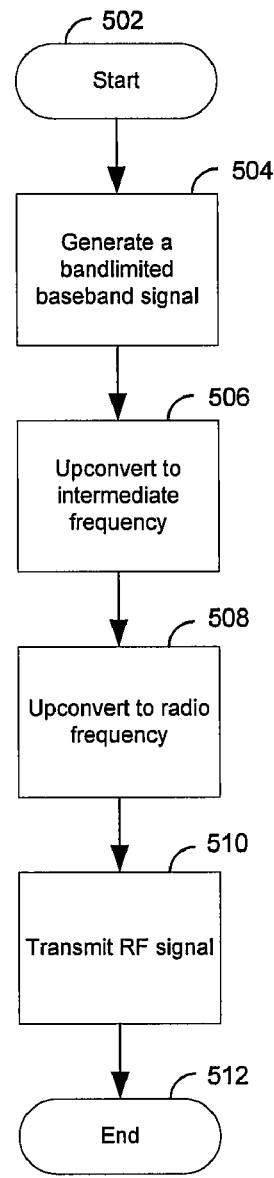
FIG. 5 is a flow chart illustrating an exemplary FM transmission process, in accordance with an embodiment of the invention.

FIG. 5 is a flow chart illustrating an exemplary FM transmission process, in accordance with an embodiment of the invention. The FM transmission process may initially start by generating a band-limited baseband signal in step 504. The band-limited baseband signal may comprise in-phase and/or quadrature signal components. The band-limited baseband signal that may be generated in step 504 may be upconverted to intermediate frequency in step 506. In various embodiments of the invention, the upconversion to radio frequency in step 508 may be achieved by upconverting the sum of the intermediate frequency signal components or by upconverting the in-phase intermediate frequency signal component and/or the quadrature intermediate frequency signal component separately. In step 510, the RF signal may then be transmitted, for example, over an antenna similar to antenna 308, illustrated in FIG. 3.

In accordance with an embodiment of the invention, a method and system for simultaneous signal transmission on multiple selected frequencies may comprise generating from a single baseband signal, a plurality of radio frequency transmission signals s(t), as explained for FIG. 3, each at a different radio frequency, for example $w_1$ and $w_2$, wherein the single baseband signal comprises an in-phase signal component $s_I(t)$ and/or a quadrature signal component $s_Q(t)$. The single baseband signal, to generate said plurality of radio frequency transmission signals s(t), may be modulated in a single radio frequency transmission chain 306, the radio frequency transmission chain 306 comprising intermediate frequency modulation 310 and radio frequency modulation 314. The plurality of radio frequency transmission signals s(t) may be a radio frequency signal and a corresponding image frequency signal, based on the intermediate frequency modulation and the radio frequency modulation, as explained in FIG. 3. The signals resulting from the intermediate frequency modulation and the radio frequency modulation may be filtered to preserve the radio frequency signal and the corresponding image frequency signal. The radio frequency signal may be centered at a frequency f1+f2 and the image frequency signal may be centered at a frequency f1−f2, where f1 and f2 are frequencies based on $w_1$ and $w_2$. The frequencies f1 and f2 may correspond to the intermediate frequency modulation and the radio frequency modulation, as shown in FIG. 4A and FIG. 4B. The plurality of radio frequency transmission signals s(t) may be frequency-modulated signals. In the radio frequency transmission chain, a plurality of intermediate frequency signal components may be summed in adder 424 and the radio frequency modulation may be performed on the sum of the intermediate frequency signal components in multiplier 426. In another embodiment of the invention, a plurality of radio frequency signal components may be summed in adder 408 in the radio frequency transmission chain, to obtain the plurality of radio frequency transmission signals s(t). The single baseband signal may be band-limited and the in-phase signal component and/or the quadrature component may be up-converted to radio frequency signals, as explained for FIG. 3.

Another embodiment of the invention may provide a machine-readable storage, having stored thereon, a computer program having at least one code section executable by a machine, thereby causing the machine to perform the steps as described herein for simultaneous signal transmission on multiple selected frequencies.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
   performing by one or more processors and/or circuits in a transmitter:
      generating from a single baseband signal, a plurality of radio frequency transmission signals each at a different radio frequency, wherein said single baseband signal comprises an in-phase signal component and/or a quadrature signal component;
      modulating in a single radio frequency transmission chain, said single baseband signal, to generate said plurality of radio frequency transmission signals, said radio frequency transmission chain comprising intermediate frequency modulation and radio frequency modulation.

2. The method according to claim 1, wherein said plurality of radio frequency transmission signals comprises a radio frequency signal and a corresponding image frequency signal, based on said intermediate frequency modulation and said radio frequency modulation.

3. The method according to claim 2, comprising filtering signals resulting from said intermediate frequency modulation and said radio frequency modulation to preserve said radio frequency signal and said corresponding image frequency signal.

4. The method according to claim 2, wherein said radio frequency signal is centered at a frequency f1+f2 and said image frequency signal is centered at a frequency f1−f2, where f1 and f2 are frequencies.

5. The method according to claim 4, wherein said frequencies f1 and f2 correspond to said radio frequency modulation and said intermediate frequency modulation.

6. The method according to claim 1, wherein said plurality of radio frequency transmission signals are frequency modulated signals.

7. The method according to claim 1, comprising summing, in said radio frequency transmission chain, a plurality of intermediate frequency signal components and perform said radio frequency modulation on said sum of said plurality of intermediate frequency signal components.

8. The method according to claim 1, comprising summing, in said radio frequency transmission chain, a plurality of radio frequency signal components, to obtain said plurality of radio frequency transmission signals.

9. The method according to claim 1, comprising band-limiting said a single baseband signal.

10. The method according to claim 1, comprising up-converting said in-phase signal component and/or said quadrature signal component to radio frequency signals.

11. A system for processing communication signals, the system comprising:
   one or more circuits, said one or more circuits enable:
      generation from a single baseband signal, of a plurality of radio frequency transmission signals each at a different radio frequency, wherein said single baseband signal comprises an in-phase signal component and/or a quadrature signal component;
      modulation in a single radio frequency transmission chain, of said single baseband signal, to generate said plurality of radio frequency transmission signals, said radio frequency transmission chain comprising intermediate frequency modulation and radio frequency modulation.

12. The system according to claim 11, wherein said plurality of radio frequency transmission signals is a radio frequency signal and a corresponding image frequency signal, based on said intermediate frequency modulation and said radio frequency modulation.

13. The system according to claim 12, wherein said one or more circuits filter signals resulting from said intermediate frequency modulation and said radio frequency modulation to preserve said radio frequency signal and said corresponding image frequency signal.

14. The system according to claim 12, wherein said radio frequency signal is centered at a frequency f1+f2 and said image frequency signal is centered at a frequency f1−f2, where f1 and f2 are frequencies.

15. The system according to claim 14, wherein said frequencies f1 and f2 correspond to said radio frequency modulation and said intermediate frequency modulation.

16. The system according to claim 11, wherein said plurality of radio frequency transmission signals are frequency modulated signals.

17. The system according to claim 11, wherein said one or more circuits sum, in said radio frequency transmission chain, a plurality of intermediate frequency signal components and perform said radio frequency modulation on said sum of said plurality of intermediate frequency signal components.

18. The system according to claim 11, wherein said one or more circuits sum, in said radio frequency transmission chain, a plurality of radio frequency signal components, to obtain said plurality of radio frequency transmission signals.

19. The system according to claim 11, wherein said one or more circuits band-limit said a single baseband signal.

20. The system according to claim 11, wherein said one or more circuits up-convert said in-phase signal component and/or said quadrature signal component to radio frequency signals.

* * * * *